US008432008B2

(12) United States Patent
Leverrier et al.

(10) Patent No.: US 8,432,008 B2
(45) Date of Patent: Apr. 30, 2013

(54) PACKAGE FOR VACUUM ENCAPSULATION OF AN ASSOCIATED MICROELECTROMECHANICAL SYSTEM, AND A METHOD FOR DETECTING A PROBLEM WITH A SOLDER JOINT IN SUCH AN ASSEMBLY

(75) Inventors: Bertrand Leverrier, Montelier (FR); Dominique Leduc, Rennes (FR)

(73) Assignee: Thales, Neuilly sur Seine (FR)

( * ) Notice: Subject to any disclaimer, the term of this patent is extended or adjusted under 35 U.S.C. 154(b) by 65 days.

(21) Appl. No.: 13/078,324

(22) Filed: Apr. 1, 2011

(65) Prior Publication Data

US 2012/0012951 A1 Jan. 19, 2012

(30) Foreign Application Priority Data

Apr. 2, 2010 (FR) ...................................... 10 01395

(51) Int. Cl.
*G01P 15/08* (2006.01)
(52) U.S. Cl.
USPC ............... 257/417; 257/E29.324; 324/762.02
(58) Field of Classification Search .................. 257/417, 257/E29.324; 324/762, 762.02
See application file for complete search history.

(56) References Cited

U.S. PATENT DOCUMENTS

2007/0159803 A1 7/2007 Eskridge
2009/0137079 A1* 5/2009 Kuisma ........................... 438/51

OTHER PUBLICATIONS

French Search Report from FR 1001395 issued Jan. 7, 2011.

\* cited by examiner

*Primary Examiner* — Kimberly Rizkallah
*Assistant Examiner* — Timor Karimy
(74) *Attorney, Agent, or Firm* — Stroock & Stroock & Lavan LLP

(57) ABSTRACT

Package (BT) for vacuum encapsulation of a microelectromechanical system (MEMS) provided with an electrically conductive element intended to be soldered to said package (BT), said package (BT) comprising a metallized base (FM), designed to be soldered to said microelectromechanical system (MEMS), and output electrical contacts (CES), electrically connected to electrical-contact elements of said microelectromechanical system. Said metallized base (FM) comprises a plurality of metallized surface portions (PSM), respectively bounded by an unmetallized solder stop region, and respectively connected to the rest of the metallized base (FM) by a metallized track (PTEM), having a small width relative to the corresponding width of said portion (PSM), said metallized surface portions (PSM) being designed to be soldered to said microelectromechanical system (MEMS).

9 Claims, 3 Drawing Sheets

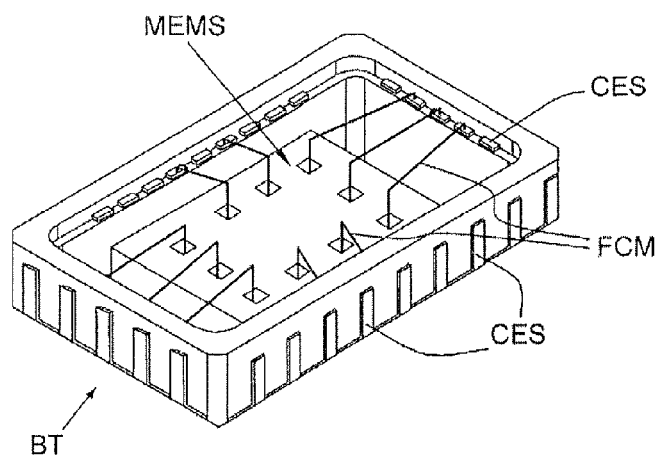
FIG.1, Prior Art
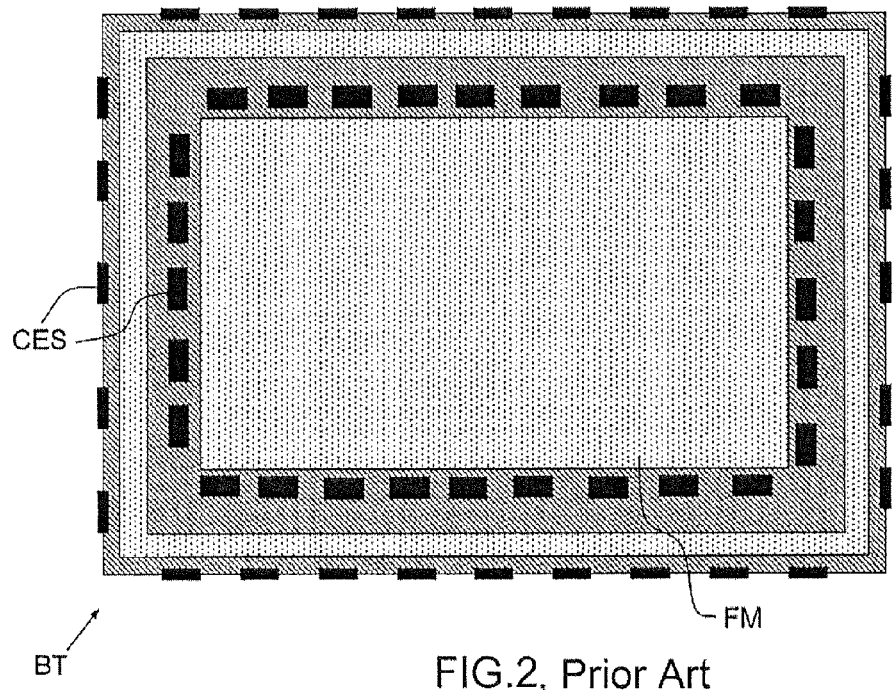
FIG.2, Prior Art

PACKAGE FOR VACUUM ENCAPSULATION OF AN ASSOCIATED MICROELECTROMECHANICAL SYSTEM, AND A METHOD FOR DETECTING A PROBLEM WITH A SOLDER JOINT IN SUCH AN ASSEMBLY

This application claims priority to French Patent Application No. 1001395, filed Apr. 2, 2010, the entire contents of which are incorporated herein.

The present invention relates to a package for vacuum encapsulation of a microelectromechanical system, to a microelectromechanical system vacuum assembly comprising such a package, and to a method for detecting a problem with a solder joint in such an assembly.

A microelectromechanical system is a microsystem comprising one or more mechanical elements that use electricity as an energy source, for the purpose of providing a sensor and/or actuator function with at least one structure having micron-sized dimensions, the function of which system is partially ensured by the form of this structure. The term microelectromechanical system and its abbreviation (MEMS) will be used synonymously in the remainder of the description.

In order for MEMS detectors, notably resonators, such as inertial sensors (gyrometers or accelerometers), to function it is necessary that they be located within a chamber under a vacuum of a certain quality, in order for the MEMS detector employed to function correctly and for the MEMS detector to be able to provide maximum sensitivity.

Frequently a pressure of lower than $10^{-2}$ millibar is necessary for such a detector to function correctly. The latter is therefore encapsulated in a hermetic chamber, within which the required vacuum or a reduced-pressure atmosphere has been established.

It is however difficult to obtain a high-quality vacuum level, or, in other words, a low pressure, typically a pressure of lower than $10^{-2}$ millibar, inside a package of an on-silicon MEMS detector. To overcome this problem the vacuum is often obtained by its packaging.

An exemplary process for placing MEMS under a vacuum is the use of an HTCC (high-temperature co-fired ceramic) ceramic package, more suited than another type of ceramic package called LTCC (low-temperature co-fired ceramic) packages.

LCC (lead-less chip carrier) HTCC packages without pins are generally used, but packages with pins may be used. The vacuum capping is generally achieved by soldering of a flat cap using a solder preform conventionally based on gold and tin (AuSn).

FIGS. 1 and 2 illustrate schematically an example of an LLC-type package, in which the hermetic cover soldered to the upper side of the package BT is not shown.

In FIG. 1, the package BT comprises a silicon MEMS electrically connected to output electrical contacts CES of the package BT by bonding wires FCM.

FIG. 2 shows schematically a top view of the package BT without the MEMS in which a metallized base FM, designed to be soldered to said microelectromechanical system, may be seen. The package BT also comprises output electrical contacts CES electrically connecting the interior and exterior of the package.

Most silicon MEMS chips have their electrical outputs on the upper side and a flat substrate on the lower side, the latter serving to attach the MEMS chip.

In order to obtain a satisfactory vacuum level, it is necessary to avoid the use of materials such as polymers, that may outgas into the cavity of the package BT. This therefore excludes the use of an adhesive for attaching the MEMS detector to the base of the package BT.

The MEMS detector is therefore generally attached by soldering. It is conventional to solder the centre of the chip, but this solution requires a large area to be soldered in order to achieve a satisfactory mechanical strength (shock resistance, withstand during ball bonding). This large area has the drawback of creating stresses, due to thermal expansion differentials between the silicon, solder and ceramic package BT, which do not have the same thermal expansion coefficient, in the MEMS detector which may deteriorate its operation. The solders used are, for example, mixtures of gold and tin AuSn, but other materials may be used, such as lead- or indium-based alloys.

Such an attachment may frequently lead to problems with the alignment of the microelectromechanical system and the base of the package.

If, for example, a MEMS chip is soldered to a point or pad in an LCC package, for example an LLC32 package, this soldering is carried out blind, and there are no visual means of inspecting whether the solder bump has correctly wetted the metallized land of the MEMS chip. Thus inspection, using X-rays, at several angles, is necessary to detect a non-wetting of the solder bumps, and therefore a problem with a solder joint. This inspection is therefore delicate, and costly for a mass production inspection system.

The object of the invention is to overcome the preceding problems.

According to one aspect of the invention, a package is provided for encapsulating, for example vacuum encapsulating, a microelectromechanical system provided with an electrically conductive element intended to be soldered to said package. The package comprises a metallized base, designed to be soldered to said microelectromechanical system, and output electrical contacts, electrically connected to electrical-contact elements of the microelectromechanical system. The metallized base comprises a plurality of metallized surface portions, respectively bounded by an unmetallized solder stop region and respectively connected to the rest of the metallized base by a metallized track having a small width relative to the corresponding width of said portion, said metallized surface portions being designed to be soldered to said microelectromechanical system.

Notably, in the case of high-precision MEMS, it is therefore useful to solder the silicon MEMS chip using several small solder pads distributed at the ends of the base of the package. This allows the stresses generated to be reduced but also a lateral self-alignment to be obtained when the solder bumps are melted.

According to one embodiment, said metallized base comprises a plurality of sections electrically isolated from one another, a section comprising at least one of said metallized surface portions and being connected to an output electrical contact via an electrical conductor.

Such a package allows the MEMS assembly, which will be formed after soldering, to be tested, in terms of the solder joints, in a way that is easy to carry out and inexpensive.

In one embodiment, the package comprises a soldered hermetic cover.

According to another embodiment, the ratio between the width of said portion and the width of the associated track is greater than a first threshold and the ratio between the length and the width of said track is greater than a second threshold.

For example, said first threshold is higher than 4 and said second threshold is higher than 2.

According to another embodiment, a section comprises a single metallized surface portion for soldering.

Thus, in the MEMS assembly, that will be formed after soldering, it will be easy and inexpensive to find out which solder joint is defective among the solder joints connecting the micromechanical microsystem to the package.

For example said metallized base comprises 3 or 4 sections that are electrically isolated from one another.

The cost/quality ratio is then very advantageous.

According to another aspect of the invention, a microelectromechanical system vacuum assembly is also provided comprising a package as described above, said microelectromechanical system being attached to said package by solder joints between said metallized surface portions of said sections and corresponding metallized parts on the microelectromechanical system placed, facing said portions, on the electrically conductive element of the microelectromechanical system.

Such a system makes possible very reliable, excellent alignment of the MEMS in the package.

According to another aspect of the invention, a method is also provided for detecting a problem with a solder joint in a microelectromechanical system vacuum assembly, as described above, with a plurality of sections that are electrically isolated from one another, a section comprising at least one of said metallized surface portions and being connected to an output electrical contact by an electrical conductor. In this method, the solder joints, between the metallized base of the package and the microelectromechanical system, are tested by confirming the electrical continuity, between a first section of the metallized base of the package, a solder joint of the first section, the electrically conductive element of the microelectromechanical system, a solder joint of a second section of the metallized base of the package, and the metallized base of the second section, from output electrical contacts of the package, electrically connected to the first and second sections, respectively.

Such a method makes low-cost inspection of the solder joints of the microelectromechanical system assembly possible.

According to a method of implementation, applied to a microelectromechanical system vacuum assembly, the metallized base of which is provided with a plurality of sections comprising a single metallized surface portion for soldering, the method comprises a plurality of electrical continuity tests that make it possible to determine, when a problem with a solder joint is detected, the defective solder joint between the metallized base of the package and the microelectromechanical system.

It is then also possible to determine, when a problem with a solder joint is detected, the defective solder joint between the metallized base of the package and the microelectromechanical system.

The invention will be better understood on studying a few embodiments described by way of non-limiting example and illustrated by the appended drawings in which:

FIGS. 1 and 2 illustrate schematically a package designed to vacuum encapsulate a microelectromechanical system, according to the prior art;

In the set of figures, similar elements have been given the same references.

Figure 3:
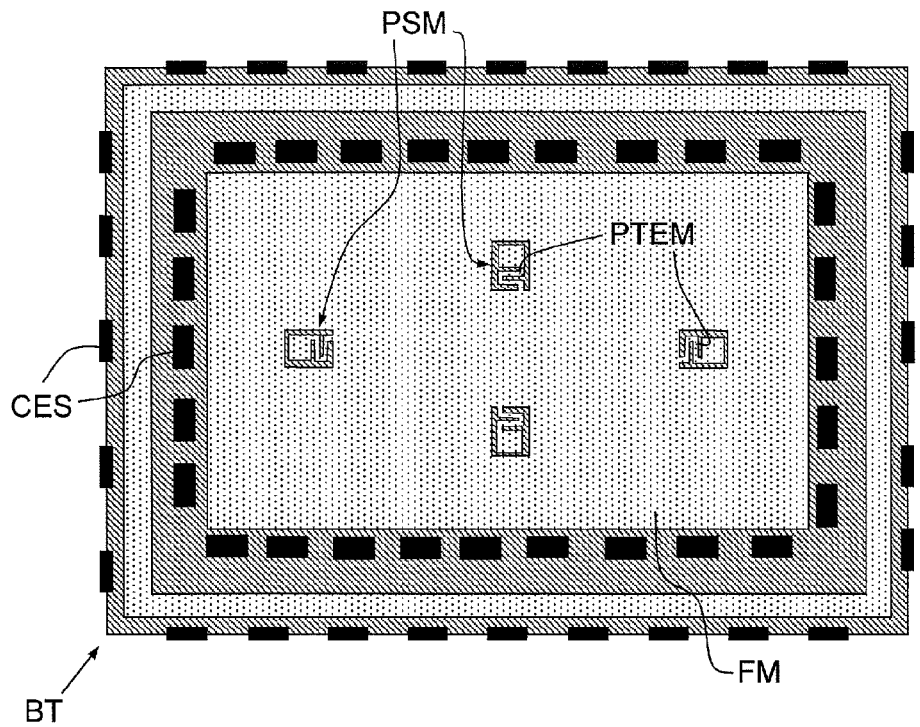
FIG. 3 illustrates schematically a package designed to vacuum encapsulate a microelectromechanical system, according to one aspect of the invention.

As illustrated in FIG. 3, a top view of a package BT comprising a metallized base FM comprises a plurality of, here 4, metallized surface portions PSM, respectively bounded by an unmetallized solder stop region and respectively connected to the rest of the metallized base by a metallized track PTEM having a small width relative to the corresponding width of said portion PSM, said metallized surface portions being designed to be soldered to said microelectromechanical system MEMS.

Preferably, the package BT may comprise 3 or 4 metallized surface portions PSM, corresponding to the best ratio between the alignment quality of the MEMS with the package and the soldering cost.

The ratio between the width of a metallized surface portion PSM and the width of the associated metallized track PTEM is higher than a first threshold S1, and the ratio between the length and the width of said track is higher than a second threshold S2, the first threshold is higher than 4 and the second threshold is higher than 2. For example, as illustrated in the present figure, a metallized track PTEM describes a serpentine path.

Figure 3A:
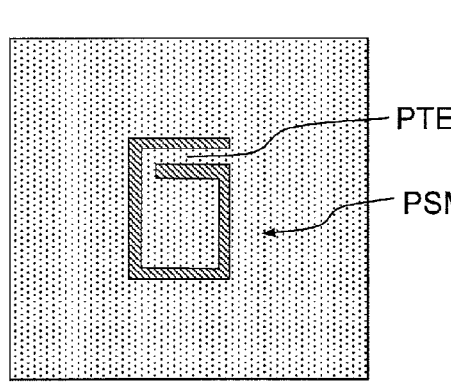
FIGS. 3a and 3b illustrate two other embodiments of a metallized track connecting an isolated portion of the metallized base to the rest of the metallized base.
Figure 3B:
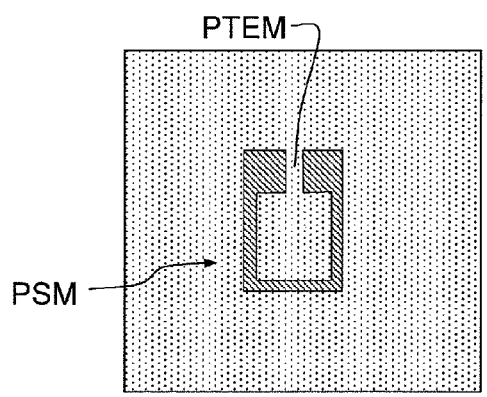

As a variant, as shown in FIGS. 3a and 3b, a metallized track PTEM may, for example, describe a right angle or a straight line.

Figure 4:
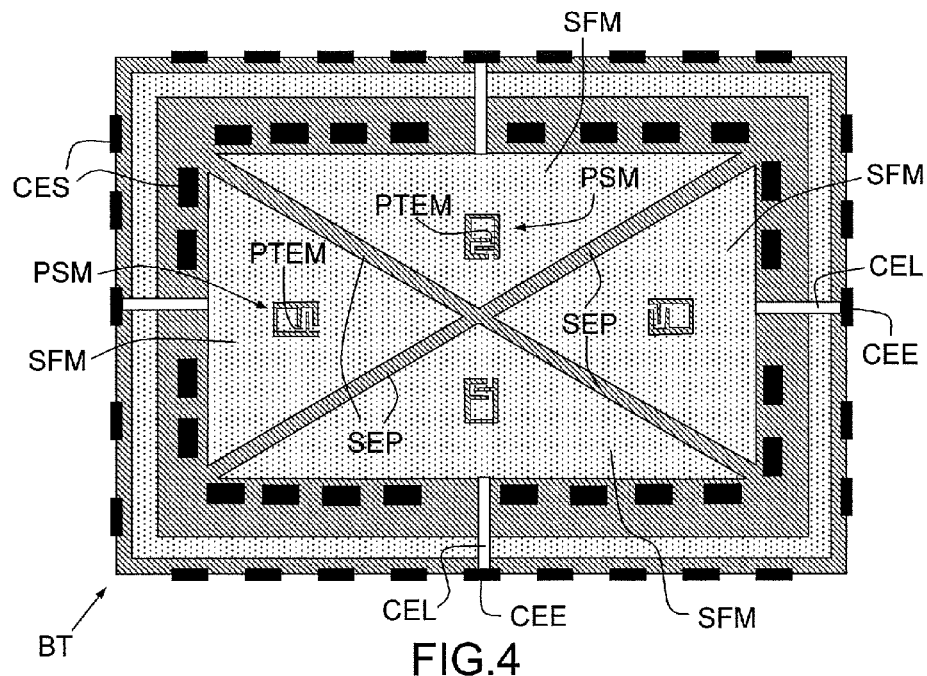
FIG. 4 illustrates a package designed to vacuum encapsulate a microelectromechanical system, according to another aspect of the invention.

FIG. 4 shows a package BT according to another aspect of the invention, the metallized base of which comprises a plurality of sections SFM that are electrically isolated from one another by sections SEP, a section SFM comprising at least one of said metallized surface portions PSM, here a single metalized surface portion PSM, and being connected to an output electrical contact CEE by an electrical conductor CEL.

Figure 5:
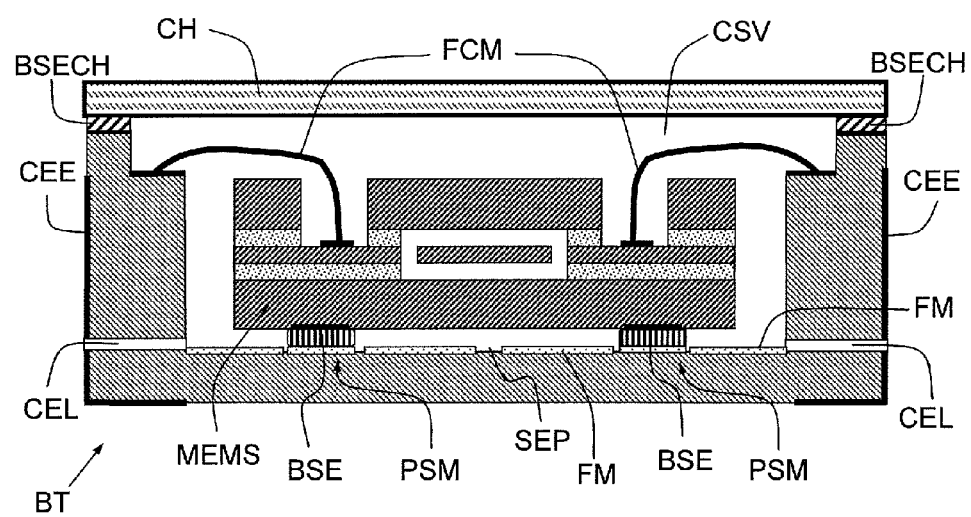
FIG. 5 illustrates a microelectromechanical system vacuum assembly comprising the package in FIG. 4, according to an aspect of the invention.

FIG. 5 shows a microelectromechanical system MEMS vacuum assembly comprising a package BT according to FIG. 4, shown in cross section. Thus the microelectromechanical system MEMS assembly is attached to the package BT by solder joints BSE. Furthermore, the hermetic cover CH is attached to the package BT by solder joints BSECH.

By virtue of the package of FIG. 4, the microelectromechanical system assembly of FIG. 5 may be tested, to detect a problem with a solder joint BSE between the metallized base FM of the package BT and the microelectromechanical system MEMS, by confirming the electrical continuity between a first section SFM of the metallized base FM of the package BT, a solder joint BSE of the first section, the electrically conductive element of the microelectromechanical system MEMS, a solder joint BSE of a second section SFM of the metallized base FM of the package, and the metallized base of the second section, from output electrical contacts CEE of the package, respectively connected to the first and second sections by respective electrical conductors CEL.

Thus, by a simple electrical conduction test it is possible to test two solder joints BSE between the microelectromechanical system MEMS and the metallized base FM, much less expensive than a test using X-rays.

Furthermore, when a metallized section SFM comprises a single metallized surface portion PSM for soldering, the method comprises a plurality of electrical continuity tests that make it possible to determine, when a problem with a solder joint BSE is detected, the defective solder joint between the metallized base FM of the package BT and the microelectromechanical system MEMS.

The invention claimed is:

1. A hermetic ceramic vacuum package for encapsulating a microelectromechanical system provided with an electrically conductive equipotential element configured to be soldered to said package, said package comprising a metalized base, the metalized base designed to be soldered to said microelectromechanical system, and output electrical contacts, the output electrical contacts electrically connected to electrical-contact elements of said microelectromechanical system, wherein said metalized base comprises a plurality of metalized surface portions, each metalized surface portion connected to at least a respective metalized track, each metalized surface portion and corresponding metalized track defined by a respective unmetalized solder stop region that generally bounds but does not fully surround the metalized surface portion and corresponding metalized track allowing for a gap in the unmetalized solder stop region such that the metalized track is provided in the gap, and the metalized base completely surrounds each respective metalized surface portion and corresponding metalized track located interior to the metalized base, each metalized surface portion connected to the rest of the metalized base by the corresponding metalized track positioned in the gap, each metalized track having a width that is smaller than a width of the corresponding metalized surface portion, said metalized surface portions being designed to be soldered to said microelectromechanical system.

2. The package according to claim 1, wherein said metalized base further comprises a plurality of sections electrically isolated from one another, each section comprising at least one of said metalized surface portions and being connected to an output electrical contact via an electrical conductor.

3. The package according to claim 2, wherein at least one section comprises a single metalized surface portion for soldering.

4. The package according to claim 2, wherein said metalized base comprises three or four sections that are electrically isolated from one another.

5. A microelectromechanical system vacuum assembly comprising a package according to claim 2, said microelectromechanical system being attached to said package by solder joints between said metallized surface portions of said sections and corresponding metallized parts on the microelectromechanical system placed, facing said portions, on the electrically conductive element of the microelectromechanical system.

6. A method for detecting a problem with a solder joint in a package according to claim 2, wherein the solder joints, between the metalized base of the package and the microelectromechanical system, are tested by confirming electrical continuity between a first section of the metalized base of the package, a solder joint of the first section, the electrically conductive element of the microelectromechanical system, a solder joint of a second section of the metalized base of the package, and the metalized base of a second section, from output electrical contacts of the package electrically connected to the first and second sections, respectively.

7. The method according to claim 6, wherein each section comprises a single metalized surface portion for soldering, the method comprising a plurality of electrical continuity tests to determine, when a problem with a defective solder joint is detected, the defective solder joint between the metalized base of the package and the microelectromechanical system.

8. The package according to claim 1, further comprising a soldered hermetic cover.

9. The package according to claim 1, wherein a ratio between the width of each metalized surface portion and the width of the associated metalized track is greater than four and a ratio between a length and the width of each metalized track is greater than two.

* * * * *